(12) United States Patent
Nomura et al.

(10) Patent No.: US 11,355,441 B2
(45) Date of Patent: Jun. 7, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazushiro Nomura, Yokohama Kanagawa (JP); Mie Matsuo, Kamakura Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/267,203

(22) Filed: Feb. 4, 2019

(65) Prior Publication Data

US 2019/0295954 A1   Sep. 26, 2019

(30) Foreign Application Priority Data

Mar. 20, 2018  (JP) .............................. JP2018-052031

(51) Int. Cl.
  *H01L 23/538*   (2006.01)
  *H01L 23/532*   (2006.01)
  *H01L 27/146*   (2006.01)

(52) U.S. Cl.
  CPC ...... *H01L 23/5386* (2013.01); *H01L 23/5385* (2013.01); *H01L 23/53223* (2013.01); *H01L 23/53238* (2013.01); *H01L 27/14636* (2013.01)

(58) Field of Classification Search
  None
  See application file for complete search history.

(56) References Cited

U.S. PATENT DOCUMENTS

| 8,896,125 | B2 | 11/2014 | Kagawa et al. |
| 9,153,495 | B2 | 10/2015 | Aoki et al. |
| 9,666,573 | B1 * | 5/2017 | Sukekawa ............... H01L 25/50 |
| 2004/0262772 | A1 * | 12/2004 | Ramanathan ........... H01L 24/11 |
| | | | 438/455 |
| 2005/0186801 | A1 * | 8/2005 | Uno .................. H01L 21/76807 |
| | | | 257/E21.252 |
| 2006/0220197 | A1 * | 10/2006 | Kobrinsky .............. H01L 24/81 |
| | | | 257/E21.705 |

(Continued)

FOREIGN PATENT DOCUMENTS

| JP | 2016092197 A | 5/2016 |
| JP | 6014354 B2 | 10/2016 |
| JP | 6031765 B2 | 11/2016 |

*Primary Examiner* — Khaja Ahmad
(74) *Attorney, Agent, or Firm* — Holtz, Holtz & Volek PC

(57) ABSTRACT

A semiconductor device according to an embodiment includes a first substrate including a first insulating layer, a first conductive layer provided in the first insulating layer, a first metal layer provided in the first insulating layer, and a second metal layer provided between the first metal layer and the first conductive layer, a linear expansion coefficient of the second metal layer being higher than that of the first metal layer; and a second substrate including a second insulating layer, and a third metal layer provided in the second insulating layer, in contact with the first metal layer. The second substrate contacts with the first substrate.

17 Claims, 13 Drawing Sheets

(56) References Cited

U.S. PATENT DOCUMENTS

| | | |
|---|---|---|
| 2008/0205027 A1 | 8/2008 | Coronel et al. |
| 2010/0096760 A1* | 4/2010 | Yu .......................... H01L 24/06 |
| | | 257/774 |
| 2013/0112849 A1* | 5/2013 | Shimotsusa ....... H01L 27/14685 |
| | | 250/206 |
| 2014/0117546 A1* | 5/2014 | Liu .................... H01L 25/0657 |
| | | 438/669 |
| 2015/0021785 A1* | 1/2015 | Lin .................... H01L 25/0657 |
| | | 257/774 |
| 2015/0076649 A1* | 3/2015 | Kim ................. H01L 27/14634 |
| | | 257/446 |
| 2015/0108644 A1* | 4/2015 | Kuang ................. H01L 25/043 |
| | | 257/751 |
| 2015/0294955 A1* | 10/2015 | Chen ...................... H01L 24/03 |
| | | 257/777 |
| 2016/0013160 A1* | 1/2016 | Chun ................. H01L 23/3192 |
| | | 257/751 |
| 2016/0190103 A1* | 6/2016 | Kabe .................... H01L 23/528 |
| | | 257/777 |
| 2017/0062366 A1* | 3/2017 | Enquist ................... H01L 24/05 |
| 2017/0243910 A1 | 8/2017 | Ashidate et al. |

\* cited by examiner

SEMICONDUCTOR DEVICE

CROSS-REFERENCE TO RELATED APPLICATION

This application is based upon and claims the benefit of priority from Japanese Patent Application No. 2018-052031, filed on Mar. 20, 2018, the entire contents of which are incorporated herein by reference.

FIELD

Embodiments described herein relate generally to a semiconductor device.

BACKGROUND

In order to achieve reduction in size, higher function or higher integration for semiconductor devices, there is a hybrid bonding technology which bond together two substrates, each of the two substrates has an insulating layer and a metal electrode exposed at a surface. In accordance with the hybrid bonding technology, for example, the surfaces of the insulating layers are hydrophilized by plasma treatment, and the two substrates are stuck together, and then subjected to an annealing treatment, thereby bonding the surfaces of the insulating layers to each other and the surfaces of the metal electrodes to each other.

When a temperature for the annealing treatment is increased, there is a possibility that, for example, voids will be generated in electrodes and metal wirings provided in the substrates, thereby causing electrode contact failures and metal conduction failures. Therefore, lowering the temperature for the annealing treatment is desired in the hybrid bonding technology.

DETAILED DESCRIPTION

Figure 1:
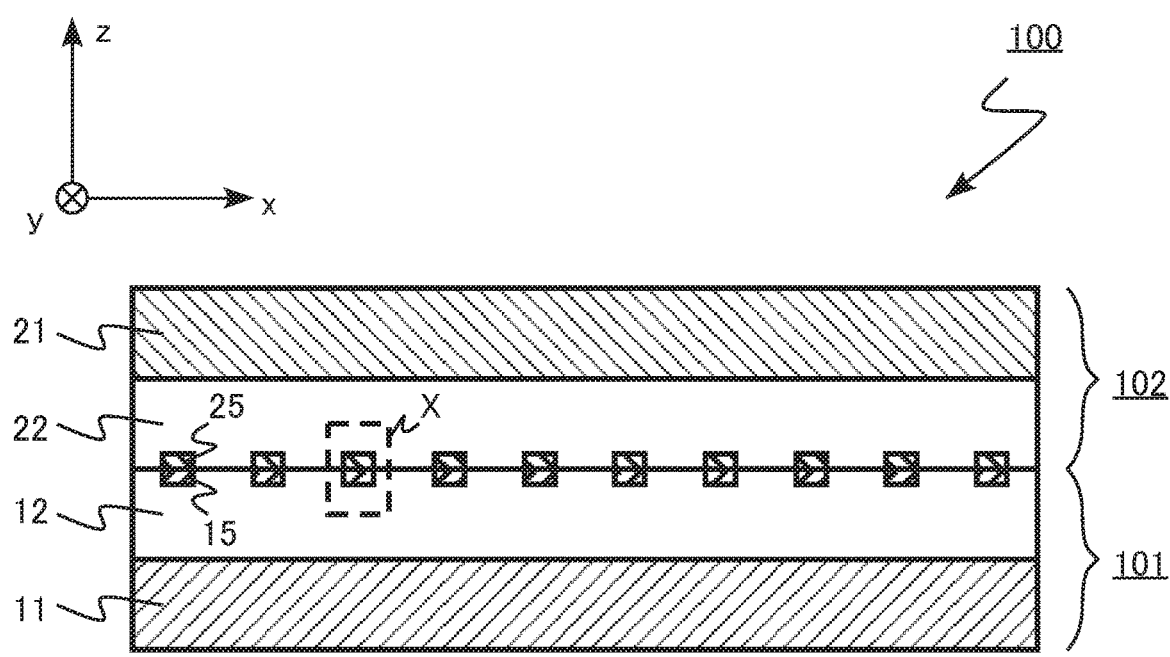
FIG. 1 is a schematic cross-sectional view of a semiconductor device according to a first embodiment.

A semiconductor device according to one aspect of the present disclosure includes: a first substrate including a first insulating layer, a first conductive layer provided in the first insulating layer, a first metal layer provided in the first insulating layer, and a second metal layer provided between the first metal layer and the first conductive layer, a linear expansion coefficient of the second metal layer being higher than a linear expansion coefficient of the first metal layer; and a second substrate being in contact with the first substrate, the second substrate including a second insulating layer, and a third metal layer provided in the second insulating layer, the third metal layer being in contact with the first metal layer.

In this specification, the same or similar members are denoted by the same reference numerals, and repeated description thereof may be omitted.

In this specification, in order to show a positional relationship between parts or the like, an upward direction of the drawing may be described as "upper" and a downward direction of the drawing may be described as "lower". In this specification, concepts of "upper" and "lower" are not necessarily intended for terms that refer to the relationships with a direction of gravity.

It is possible to measure kinds of elements constituting the electrodes and wirings described in this specification by, for example, secondary ion mass spectrometry (SIMS) or energy dispersive X-ray spectroscopy (EDX). In addition, it is possible to measure lengths such as an electrode thickness and an electrode width with, for example, a scanning electron microscope (SEM) or a transmission electron microscope (TEM).

In this specification, a metal containing copper (Cu) as its main constituent means a metal with the highest atomic ratio of copper among all of the elements constituting the metal. In this specification, a metal containing copper as its main constituent refers to, for example, a metal in which the atomic ratio of copper is 90 atomic % or higher.

In this specification, a metal containing aluminum (Al) as its main constituent means a metal with the highest atomic ratio of aluminum among all of the elements constituting the metal. In this specification, a metal containing aluminum as its main constituent refers to, for example, a metal in which the atomic ratio of aluminum is 90 atomic % or higher.

First Embodiment

A semiconductor device according to a first embodiment includes: a first substrate including a first insulating layer, a first conductive layer provided in the first insulating layer, a first metal layer provided in the first insulating layer, and a second metal layer provided between the first metal layer and the first conductive layer, a linear expansion coefficient of the second metal layer being higher than that of the first metal layer; and a second substrate including a second insulating layer, and a third metal layer provided in the second insulating layer, in contact with the first metal layer, with the second substrate in contact with the first substrate.

The semiconductor device according to the first embodiment is a semiconductor device where a first substrate and a second substrate each with an insulating layer and a metal electrode exposed at a surface thereof are bonded by a hybrid bonding technology. Hereinafter, a case where the first substrate is a logic substrate with a plurality of logic circuits formed and the second substrate is a sensor substrate with a plurality of photodiodes formed will be described as an example. In addition, a case where both the logic substrate and the sensor substrate are wafers, that is, a case of so-called "Wafer on Wafer" will be described as an example. It is possible to manufacture a plurality of image sensors by bonding the logic substrate and the sensor substrate on a wafer level and then dicing the bonded substrates. The semiconductor device according to the first embodiment is a wafer with an image sensor or a plurality of image sensors formed.

FIG. 1 is a schematic cross-sectional view of the semiconductor device according to the first embodiment. A semiconductor device 100 includes a first substrate 101 and a second substrate 102.

Hereinafter, for the sake of explanation, a z direction shown in FIG. 1 is referred to as a first direction, an x direction shown therein is referred to as a second direction, and a y direction shown therein is referred to as a third direction.

The first substrate 101 includes a semiconductor layer 11, an insulating layer 12 (first insulating layer), and a metal electrode 15. The insulating layer 12 is an example of the first insulating layer.

For example, a logic circuit is formed by the semiconductor layer 11 and a transistor or a wiring, not shown, formed in the insulating layer 12. The first substrate 101 is a logic substrate.

The semiconductor layer 11 is, for example, single crystal silicon. The insulating layer 12 is, for example, a silicon oxide layer or a silicon nitride layer. The insulating layer 12 may have a stacked structure of a silicon oxide layer and a silicon nitride layer, for example.

The metal electrode 15 is provided on a surface of the insulating layer 12. The metal electrode 15 has a function of electrically connecting the first substrate 101 and the second substrate 102.

The second substrate 102 includes a semiconductor layer 21, an insulating layer 22 (second insulating layer), and a metal electrode 25. The insulating layer 22 is an example of the second insulating layer.

For example, a sensor is formed by the semiconductor layer 21 and a photodiode or a wiring, not shown, formed in the insulating layer 22. The second substrate 102 is a sensor substrate.

The semiconductor layer 21 is, for example, single crystal silicon. The insulating layer 22 is, for example, a silicon oxide layer or a silicon nitride layer. The insulating layer 22 may have a stacked structure of a silicon oxide layer and a silicon nitride layer, for example.

The metal electrode 25 is provided on a surface of the insulating layer 22. The metal electrode 25 has a function of electrically connecting the first substrate 101 and the second substrate.

The first substrate 101 and the second substrate 102 are bonded so that the surface of the metal electrode 15 and the surface of the metal electrode 25 are brought into contact with each other. In addition, the first substrate 101 and the second substrate 102 are bonded so that the surface of the insulating layer 12 and the surface of the insulating layer 22 are brought into contact with each other.

Figure 2:
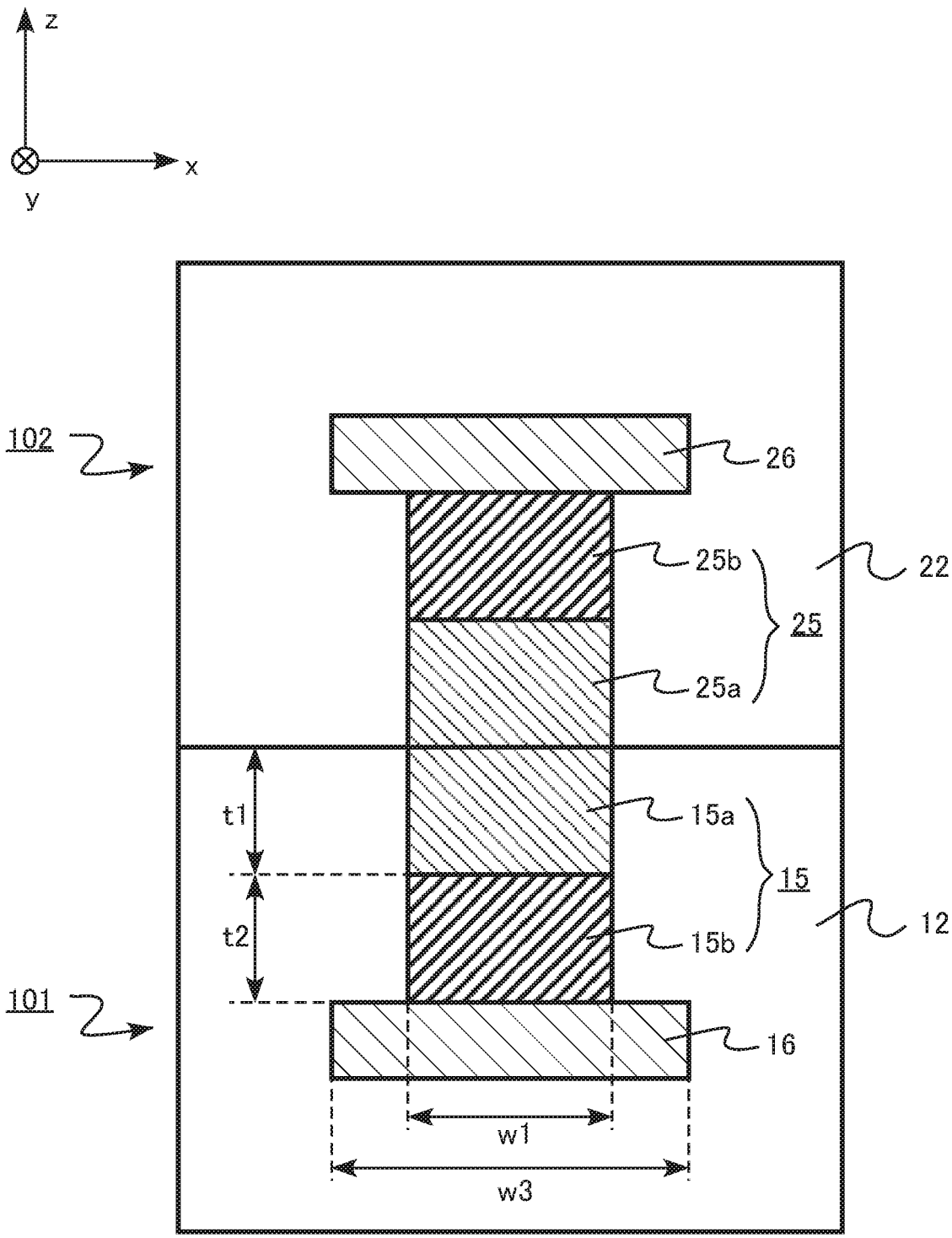
FIG. 2 is a schematic cross-sectional view of the semiconductor device according to the first embodiment.
Figure 3:
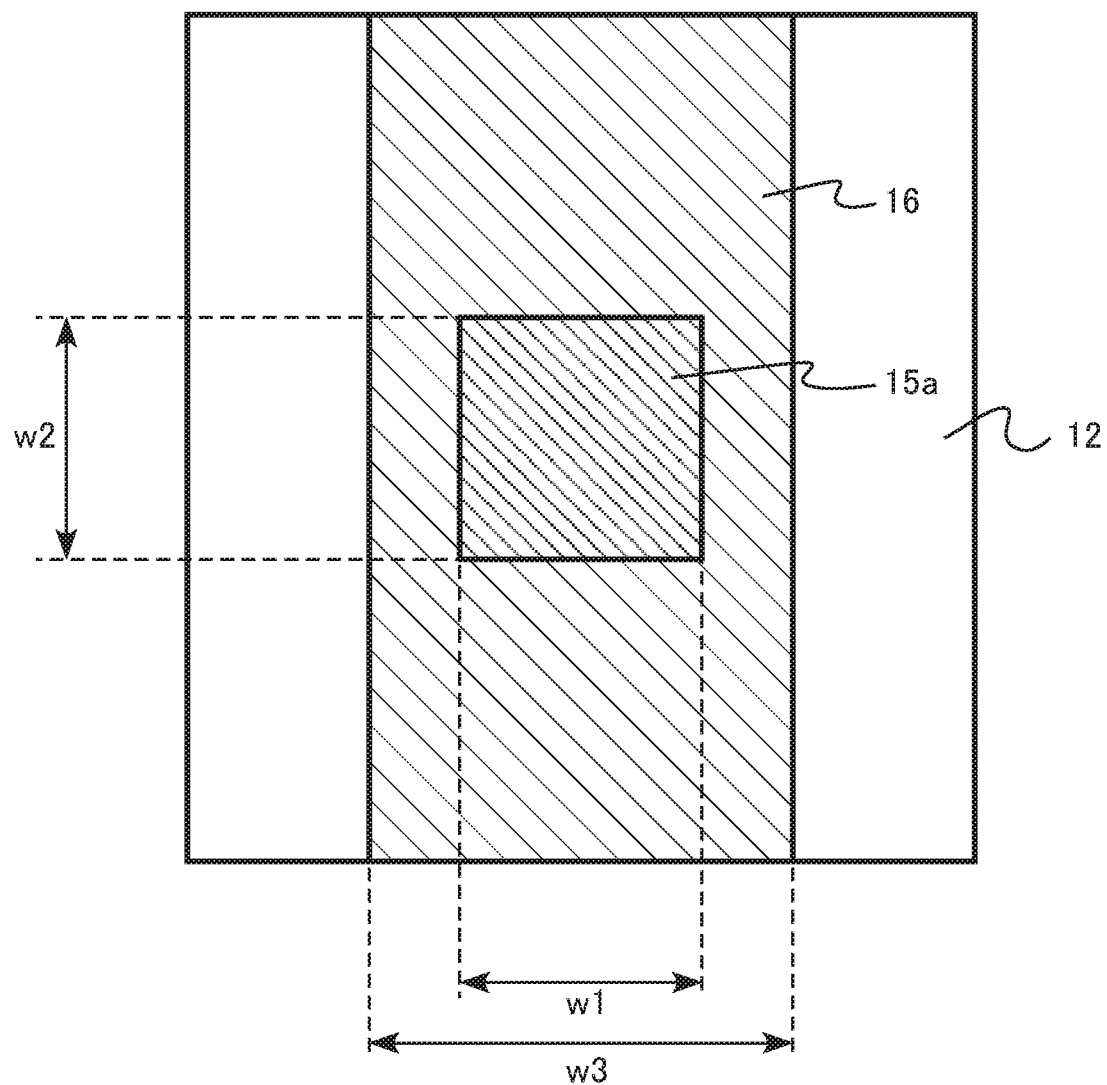
FIG. 3 is a schematic top view of the semiconductor device according to the first embodiment.

FIG. 2 is a schematic cross-sectional view of the semiconductor device according to the first embodiment. FIG. 2 is an enlarged view of a region X surrounded by a dashed line in FIG. 1. FIG. 3 is a schematic top view of the semiconductor device according to the first embodiment. FIG. 3 is a view of the region X as viewed from the first direction (z direction).

In the insulating layer 12 of the first substrate 101, a metal electrode 15 and a wiring layer 16 (first conductive layer) are provided. The metal electrode 15 includes a surface electrode 15a (first metal layer) and a buried electrode 15b (second metal layer). The wiring layer 16 is an example of the first conductive layer. The surface electrode 15a is an example of the first metal layer. The buried electrode 15b is an example of the second metal layer.

The metal electrode 15 has a two-layer structure of the surface electrode 15a and the buried electrode 15b. The buried electrode 15b is positioned between the surface electrode 15a and the wiring layer 16.

The surface electrode 15a is a metal. The buried electrode 15b is a metal. The linear expansion coefficient of the buried electrode 15b is higher than the linear expansion coefficient of the surface electrode 15a.

The surface electrode 15a is, for example, a metal containing copper (Cu) as its main constituent. The surface electrode 15a is, for example, pure copper.

The buried electrode 15b is, for example, a metal containing aluminum (Al) as its main constituent. The buried electrode 15b is, for example, an alloy of aluminum containing therein less than 10% of copper.

Lead (Pb), aluminum (Al), tin (Sn), silver (Ag), copper (Cu), gold (Au), titanium (Ti), and tungsten (W), which are examples of metal materials, are decreased in this order in a linear expansion coefficient. For example, a linear expansion coefficient of lead (Pb) is higher than that of tungsten (W).

For example, when the surface electrode 15a is pure copper, it is possible to apply, as a material for the buried electrode 15b, lead (Pb), aluminum (Al), tin (Sn), and silver (Ag) that are higher in a linear expansion coefficient than copper (Cu).

For example, the electrical resistivity of the buried electrode 15b is higher than electrical resistivity of the surface electrode 15a.

A direction in which the buried electrode 15b and the surface electrode 15a are stacked is defined as the first direction (z direction), and a direction perpendicular to the first direction (z direction) is defined as the second direction (x direction). In this case, a width (w1 in FIGS. 2 and 3) of the buried electrode 15b in the second direction is narrower than a width (w3 in FIGS. 2 and 3) of the wiring layer 16 in the second direction (x direction). In addition, a width (w2 in FIG. 3) of the buried electrode 15b in the third direction perpendicular to the second direction is narrower than a width of the wiring layer 16 in the third direction (y direction).

It is to be noted that according to the first embodiment, the widths of the surface electrode 15a and the buried electrode 15b in the second direction and the widths thereof in the third direction are equally referred to as the width w1 and the width w2, respectively. The width w1 and the width w2 are, for example, 0.1 μm or more and 2.0 μm or less.

A thickness (t2 in FIG. 2) of the buried electrode 15b in the first direction is 30% or more and 90% or less of a sum ((t1+t2) in FIG. 2) of a thickness (t1 in FIG. 2) of the surface electrode 15a in the first direction and the thickness t2 of the buried electrode 15b in the first direction.

The thickness t1 of the surface electrode 15a in the first direction is, for example, 100 nm or more and 1 μm or less.

The thickness t2 of the buried electrode 15b in the first direction is, for example, 100 μm or more and 1 μm or less.

The wiring layer 16 is, for example, a metal, a metal compound, or a semiconductor.

In the insulating layer 22 of the second substrate 102, a metal electrode 25 and a wiring layer 26 (second conductive layer) are provided. The metal electrode 25 includes a surface electrode 25a (third metal layer) and a buried electrode 25b (fourth metal layer). The wiring layer 26 is an example of the second conductive layer. The surface electrode 25a is an example of the third metal layer. The buried electrode 25b is an example of the fourth metal layer.

For example, the metal electrode 25 has a structure similar to that of the metal electrode 15. In addition, the wiring layer 26 has a configuration similar to that of the wiring layer 16.

The metal electrode 25 has a two-layer structure of the surface electrode 25a and the buried electrode 25b. The buried electrode 25b is located between the surface electrode 25a and the wiring layer 26.

The surface electrode 25a is a metal. The buried electrode 25b is a metal. A linear expansion coefficient of the buried electrode 25b is higher than a linear expansion coefficient of the surface electrode 25a.

The surface electrode 25a is, for example, a metal containing copper (Cu) as its main constituent. The surface electrode 25a is, for example, pure copper.

The surface electrode 25a is, for example, the same material as the surface electrode 15a. The surface electrode 25a and the surface electrode 15a make contact with each other. The surface electrode 25a and the surface electrode 15a have, for example, a continuous metal structure.

The buried electrode 25b is, for example, a metal containing aluminum (Al) as its main constituent. The buried electrode 25b is, for example, an alloy of aluminum containing therein less than 10% of copper.

Lead (Pb), aluminum (Al), tin (Sn), silver (Ag), copper (Cu), gold (Au), titanium (Ti), and tungsten (W), which are examples of metal materials, are decreased in this order in a linear expansion coefficient. For example, a linear expansion coefficient of lead (Pb) is higher than that of tungsten (W).

For example, when the surface electrode 25a is pure copper, it is possible to apply, as a material for the buried electrode 25b, lead (Pb), aluminum (Al), tin (Sn), and silver (Ag) that are higher in a linear expansion coefficient than copper (Cu).

For example, an electrical resistivity of the buried electrode 25b is higher than an electrical resistivity of the surface electrode 25a.

The wiring layer 26 is, for example, a metal, a metal compound, or a semiconductor.

Next, an example of a method for manufacturing the semiconductor device according to the first embodiment will be described.

FIGS. 4, 5, 6, 7, and 8 are explanatory diagrams of the method for manufacturing the semiconductor device according to the first embodiment. FIGS. 4, 5, 6, 7, and 8 are cross-sectional views of the semiconductor device according to the first embodiment in the process of manufacture. FIGS. 4, 5, 6, 7, and 8 show cross sections of regions corresponding to FIG. 2. It is to be noted that the descriptions of the methods for manufacturing the logic circuit, the photodiode, and the like will be omitted.

First, the first substrate 101 is manufactured. The wiring layer 16 in the insulating layer 12 is formed. In the insulating layer 12, a contact hole 50 is formed where the wiring layer 16 is exposed at the bottom. The contact hole 50 is formed by, for example, dry etching.

Figure 4:
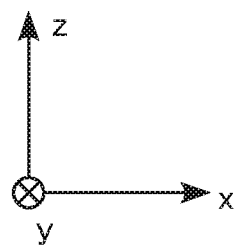
FIG. 4 is an explanatory diagram of a method for manufacturing the semiconductor device according to the first embodiment.
Figure 4:
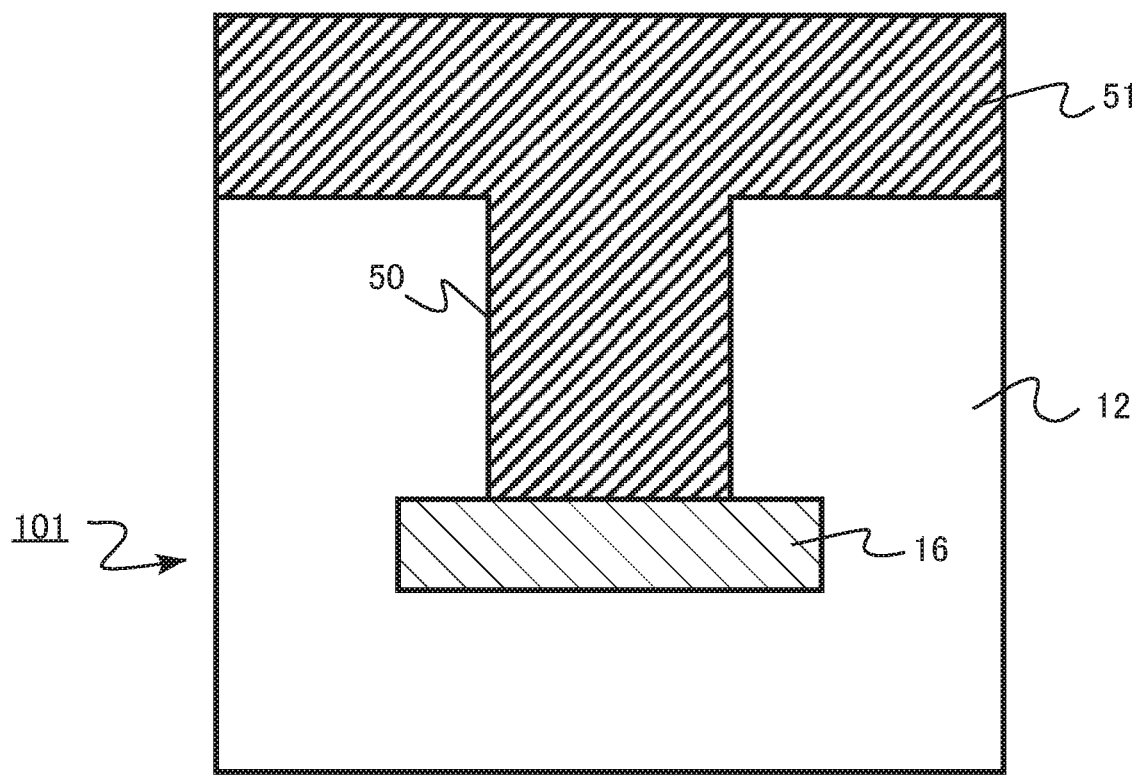

Next, a first metal film 51 is formed inside the contact hole 50 and on the surface of the insulating layer 12, for example, with the use of a sputtering method (FIG. 4).

Figure 5:
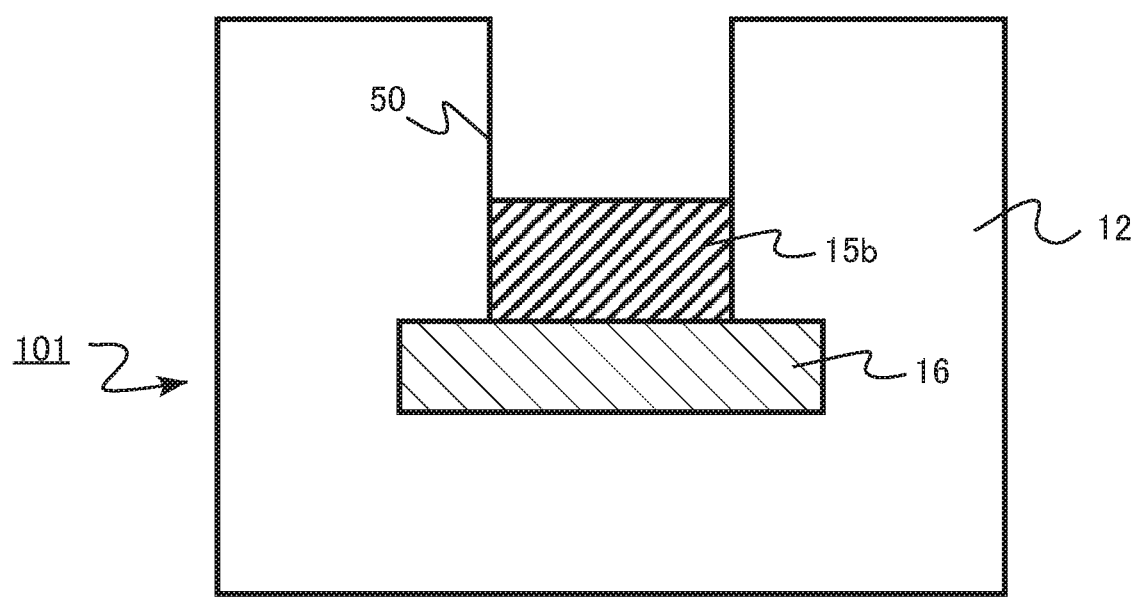
FIG. 5 is an explanatory diagram of a method for manufacturing the semiconductor device according to the first embodiment.

Next, the first metal film 51 is etched back, for example, with the use of dry etching to form the buried electrode 15b in the contact hole 50 (FIG. 5).

Figure 6:
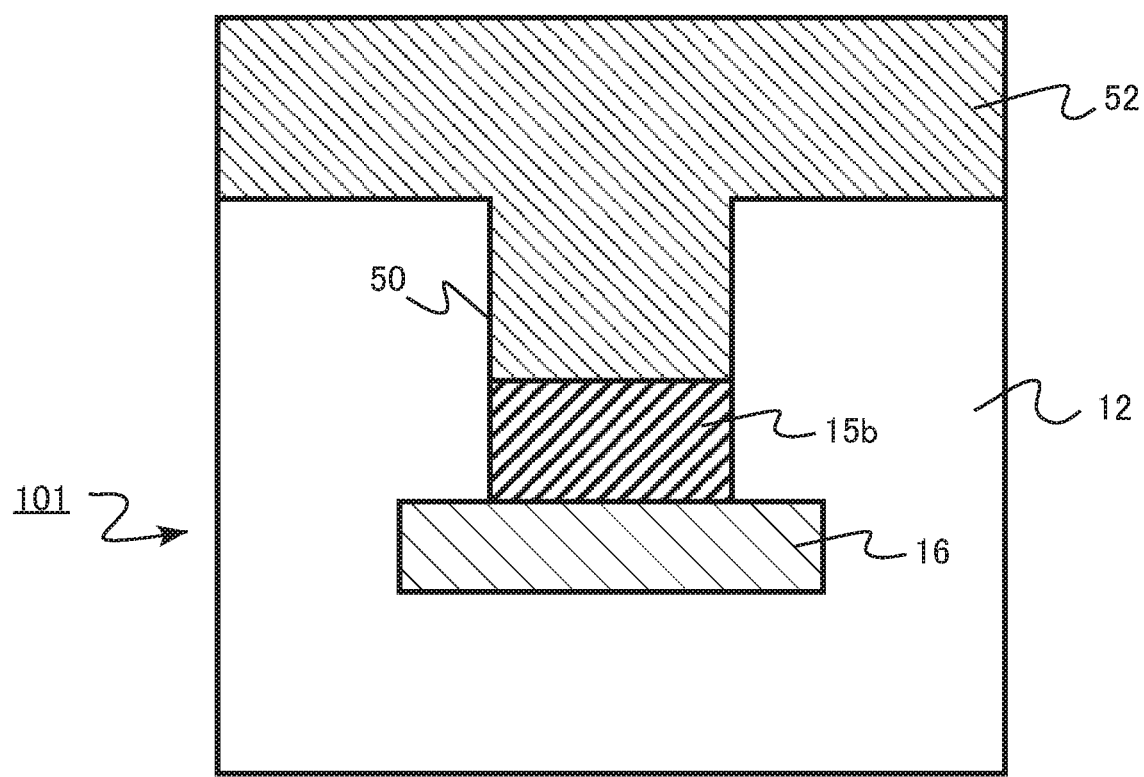
FIG. 6 is an explanatory diagram of the method for manufacturing the semiconductor device according to the first embodiment.

Next, a second metal film 52 is formed, for example, by electrolytic plating, inside the contact hole 50 and on the surface of the insulating layer 12 (FIG. 6). A linear expansion coefficient of the first metal film 51 is higher than a linear expansion coefficient of the second metal film 52.

Figure 7:
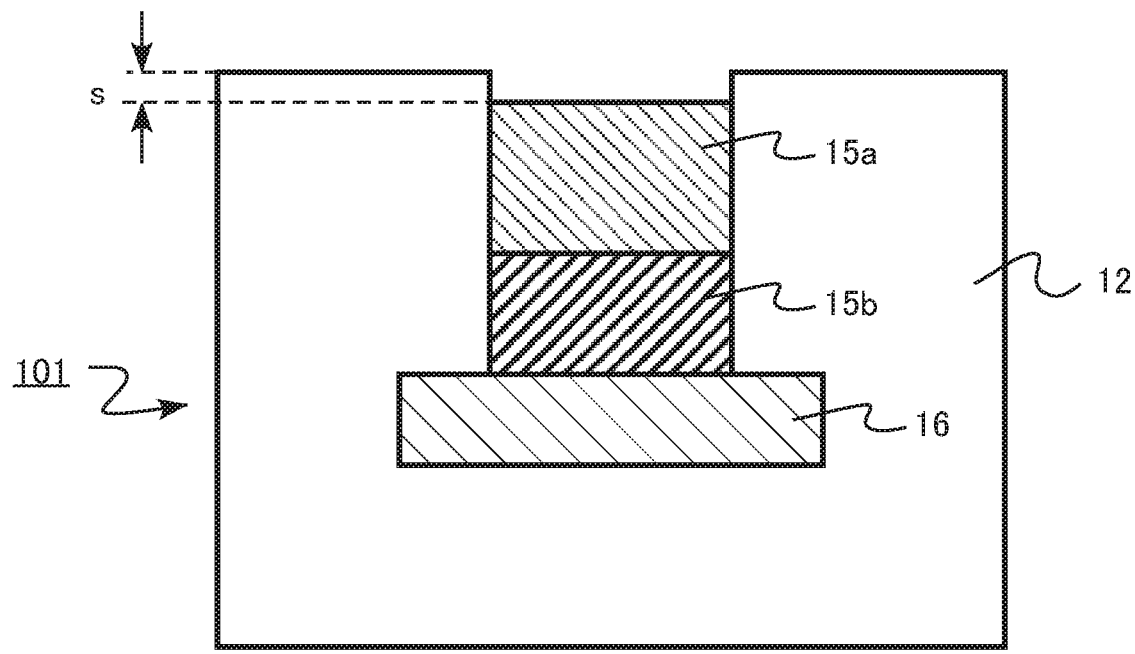
FIG. 7 is an explanatory diagram of the method for manufacturing the semiconductor device according to the first embodiment.

Next, the second metal film 52 on the surface of the insulating layer 12 is removed, for example, with the use of chemical mechanical polishing (CMP) to form the surface electrode 15a (FIG. 7). In this regard, a step (s in FIG. 7) is produced by dishing between the surface of the surface electrode 15a and the surface of the insulating layer 12.

Next, the wiring layer 26, the buried electrode 25b, and the surface electrode 25a are formed in the second substrate 102 in a similar way to the first substrate 101.

Next, the surfaces of the first substrate 101 and second substrate 102 are made hydrophilic. The surfaces are made hydrophilic by plasma treatment, for example.

Figure 8:
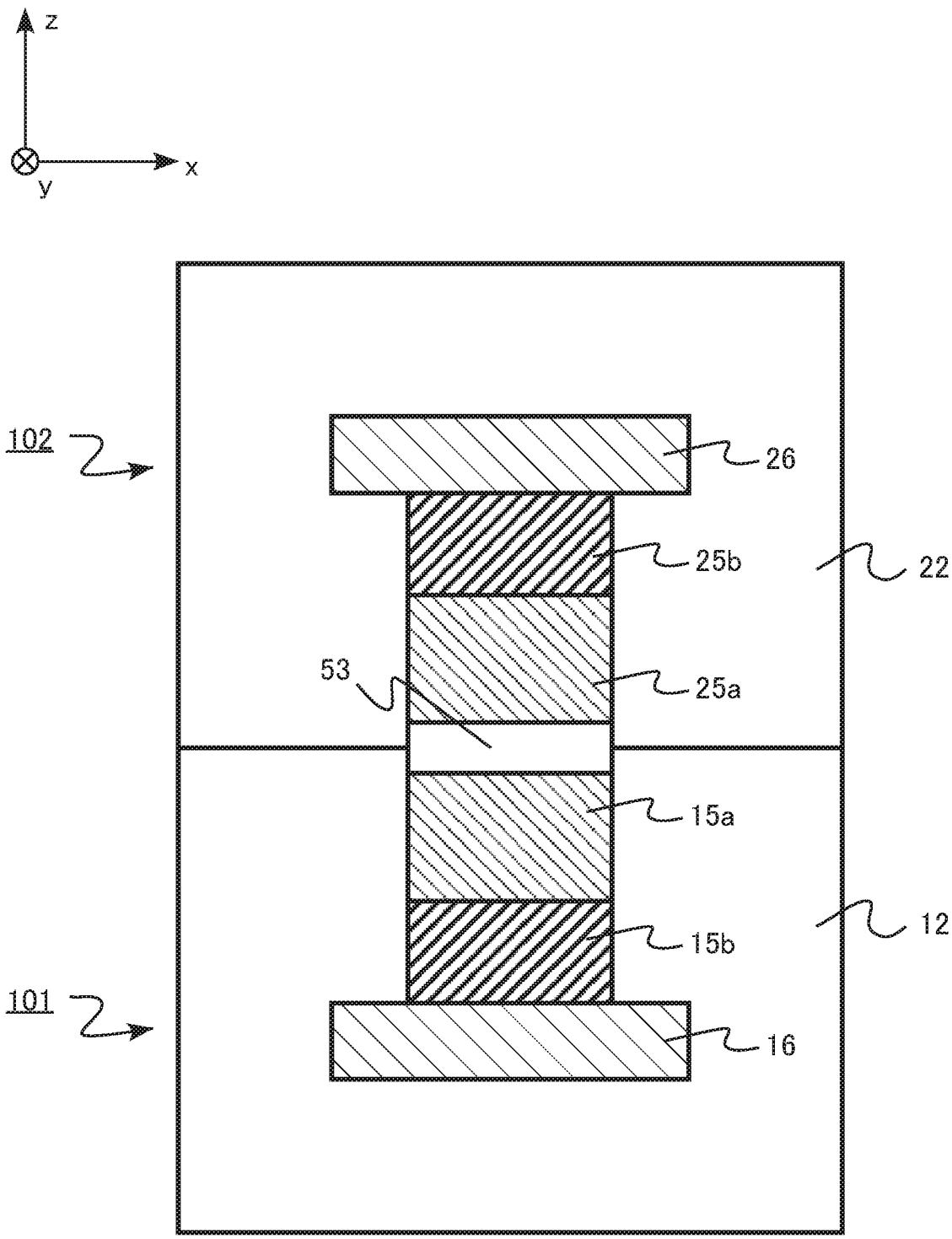
FIG. 8 is an explanatory diagram of the method for manufacturing the semiconductor device according to the first embodiment.

Next, the insulating layer 12 of the first substrate 101 and the insulating layer 22 of the second substrate 102 are stuck together so as to make contact with each other (FIG. 8). In this regard, a gap 53 is present between the surface electrode 15a and the surface electrode 25a.

Next, an annealing treatment is performed. The annealing treatment bonds the insulating layer 12 and the insulating layer 22, and bonds the surface electrode 15a and the surface electrode 25a. The gap 53 between the surface electrode 15a and the surface electrode 25a disappears due to thermal expansion of the surface electrode 15a, the buried electrode 15b, the surface electrode 25a, and the buried electrode 25b.

The annealing treatment is performed, for example, in an inert gas atmosphere. A temperature of the annealing treatment is, for example, 300° C. or higher and 380° C. or lower.

Next, a function and effect of the first embodiment will be described.

Figure 9:
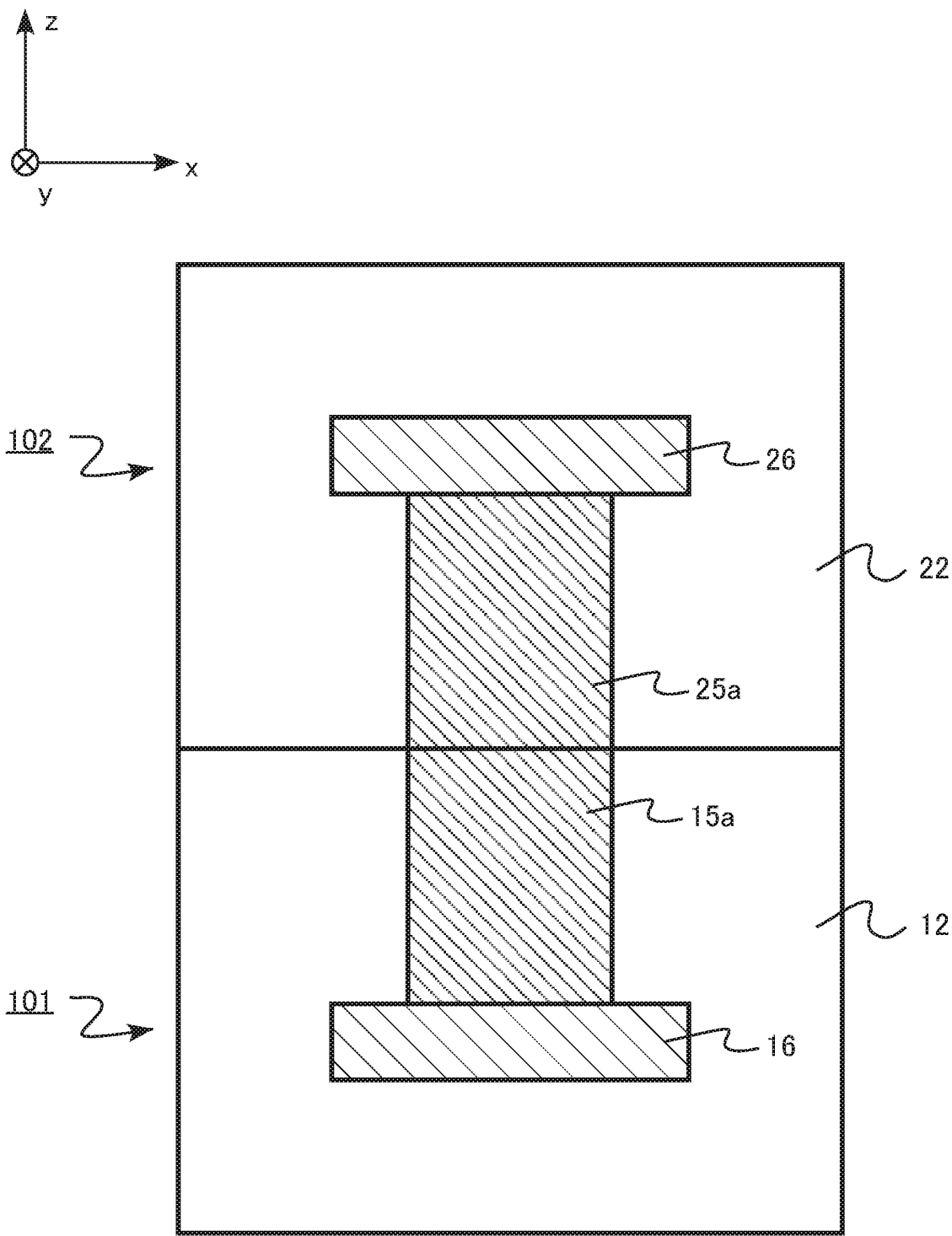
FIG. 9 is a schematic cross-sectional view of a semiconductor device according to a comparative embodiment.

FIG. 9 is a schematic cross-sectional view of a semiconductor device according to a comparative embodiment. FIG. 9 is a cross-sectional view corresponding to FIG. 2 according to the first embodiment.

A semiconductor device according to the comparative example is different from the semiconductor device according to the first embodiment in that a metal electrode of a substrate 101 has a single-layer structure of only a surface electrode 15a, whereas a substrate 102 has a single-layer structure of only a surface electrode 25a. The semiconductor device according to the comparative embodiment includes no buried electrode 15b or buried electrode 25b.

Figure 10:
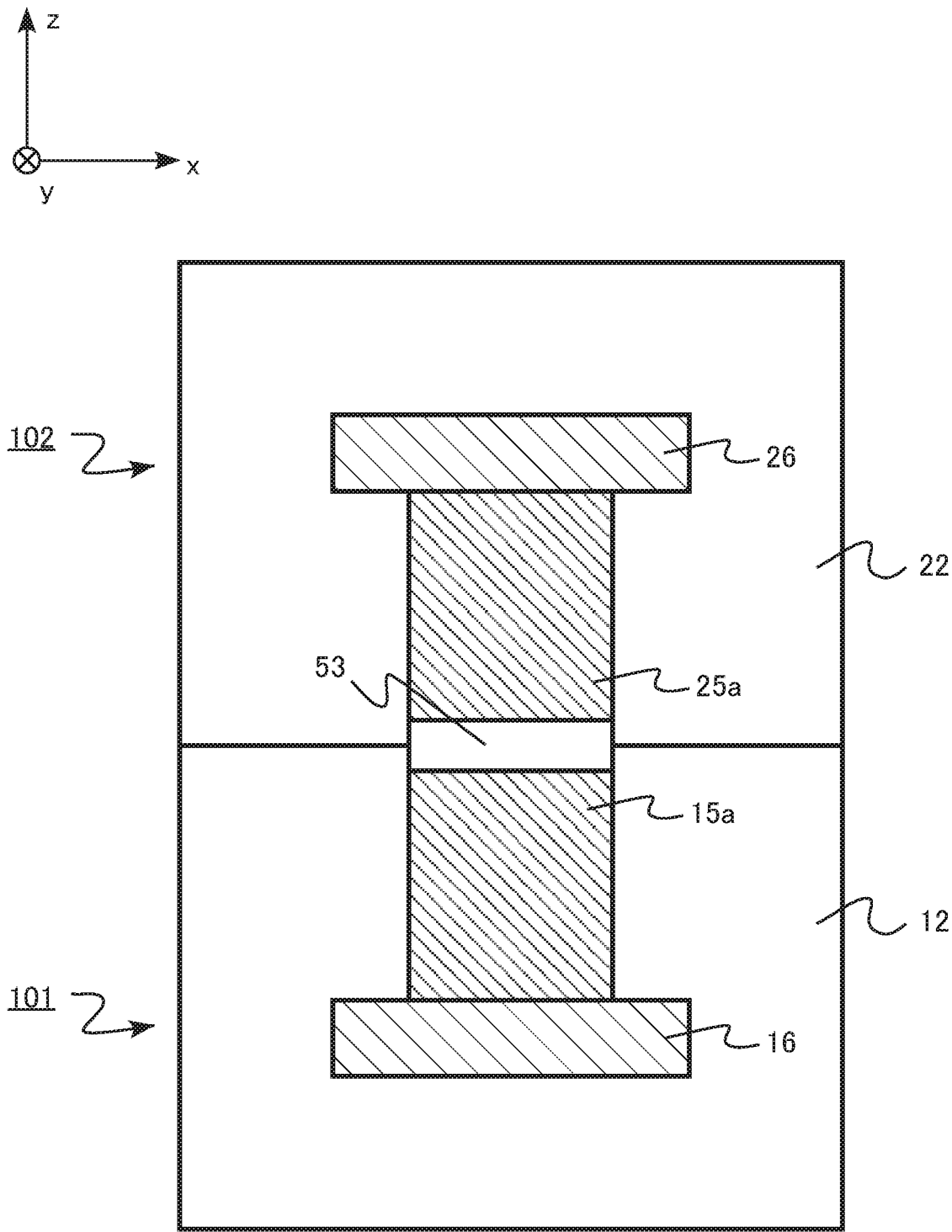
FIG. 10 is a cross-sectional view of the semiconductor device according to the comparative embodiment in the process of manufacture.

FIG. 10 is a cross-sectional view of the semiconductor device according to the comparative embodiment in the process of manufacture. FIG. 10 is a cross-sectional view just before performing an annealing treatment for bonding. As in the first embodiment, a gap 53 is present between the surface electrode 15a and the surface electrode 25a.

Subsequently, there is need for the annealing treatment to cause the gap 53 between the surface electrode 15a and the surface electrode 25a to disappear due to thermal expansion of the surface electrode 15a and the surface electrode 25a.

The annealing treatment is performed at a high temperature, thereby increasing thermal expansion amounts of the surface electrode 15a and surface electrode 25a, and thus making it easy to cause the gap 53 to disappear. However, when the temperature for the annealing treatment is increased, for example, there is a possibility that voids will be generated in electrodes and metal wirings provided in the substrates, thereby causing electrode contact failures and metal wiring conduction failures. Therefore, lowering the temperature for the annealing treatment is desired.

In the semiconductor device according to the first embodiment, the metal electrode 15 and the metal electrode 25 respectively include the buried electrode 15b and the buried electrode 25b which are higher in linear expansion coefficients than the surface electrode 15a and the surface electrode 25a. Therefore, even when the annealing treatment is performed at the same temperature as in the comparative embodiment, thermal expansion amounts of the metal electrode 15 and metal electrode 25 are increased, thereby making it easy to cause the gap 53 to disappear. In other words, as long as the gap 53 has the same size, it is possible to perform the annealing treatment at a lower temperature than in the case of the comparative embodiment.

The surface electrode 15a and the surface electrode 25a are preferably metals containing copper as their main constituent, and more preferably, pure copper. The metals containing copper as their main constituent are preferred because it is easy to bond the metals. In addition, the metals containing copper as their main constituent are preferred because the metals are low in electric resistivity.

The materials of the buried electrode 15b and buried electrode 25b are preferably metals containing aluminum as their main constituent. The linear expansion coefficient of aluminum is larger as compared with, for example, copper, which is preferable. In addition, aluminum is higher in electrical resistivity than copper, but relatively low, which is preferable.

Figure 11:
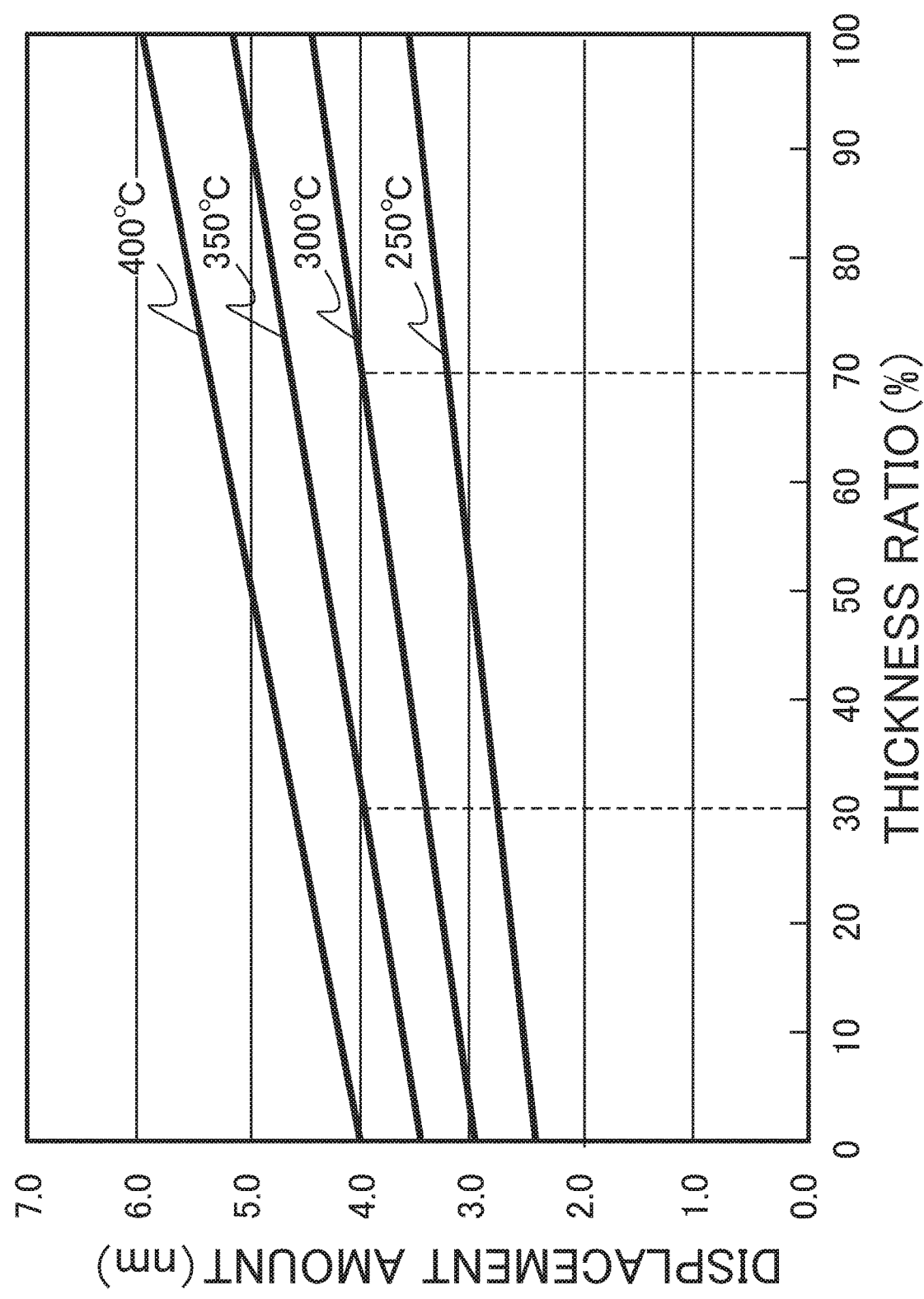
FIG. 11 is an explanatory diagram of a function and effect of the semiconductor device according to the first embodiment.

FIG. 11 is an explanatory diagram of the function and effect of the semiconductor device according to the first embodiment. FIG. 11 is a diagram showing a relationship between a thickness ratio between respective layers and an amount of displacement due to thermal expansion of metal electrode surfaces for the metal electrode which has a two-layer structure of copper and aluminum. The temperature of the annealing treatment is changed to 250° C., 300° C., 350° C., and 400° C.

It is assumed that the material of the surface electrode 15a is copper, whereas the material of the buried electrode 15b is aluminum. A thickness ratio on a horizontal axis refers to a ratio of the thickness (t2 in FIG. 2) of the buried electrode 15b to the thickness ((t1+t2) in FIG. 2) of the metal electrode 15. In FIG. 11, it is assumed that the thickness of the metal electrode 15 is 500 nm.

In the case of the comparative embodiment, the buried electrode 15b is not present. Therefore, as seen in FIG. 11, the absence corresponds to the thickness ratio in the case of 0%. An amount of displacement in the case of annealing at 400° C. is 4 nm. Therefore, as long as a dishing amount of the metal electrode 15 is 4 nm or less, the gap 53 will disappear.

In the case of the first embodiment with the presence of the buried electrode 15b, the thickness ratio of 30% achieves, even in the case of annealing at 350° C., 4 nm which is the same displacement amount as in the case of annealing at 400° C. according to the comparative embodiment. Further, the thickness ratio of 70% achieves, even in the case of annealing at 300° C., 4 nm which is the same displacement amount as in the case of annealing at 400° C. according to the comparative embodiment.

Therefore, according to the first embodiment, including the buried electrode 15b which is high in a linear expansion coefficient makes it possible to lower the temperature for the annealing treatment.

From a viewpoint of lowering the temperature for the annealing treatment, the thickness (t2 in FIG. 2) of the buried electrode 15b in the first direction is preferably 30% or more, more preferably 50% or more, and even more preferably 70% or more of the sum ((t1+t2) in FIG. 2) of the thickness (t1 in FIG. 2) of the surface electrode 15a in the first direction and the thickness t2 of the buried electrode 15b in the first direction.

Similarly, the thickness of the buried electrode 25b in the first direction is preferably 30% or more, more preferably 50% or more, and even more preferably 70% or more of the sum of the thickness of the surface electrode 25a in the first direction and the thickness of the buried electrode 25b in the first direction.

As described above, according to the first embodiment, a semiconductor device can be achieved which is capable of lowering the temperature for the annealing treatment.

Second Embodiment

A semiconductor device according to a second embodiment is different from the semiconductor device according to the first embodiment in that a barrier metal is included between a first metal layer and a second metal layer, and in that a barrier metal is included between the second metal layer and a first conductive layer. Hereinafter, the description of content that overlaps with the first embodiment will be partially omitted.

Figure 12:
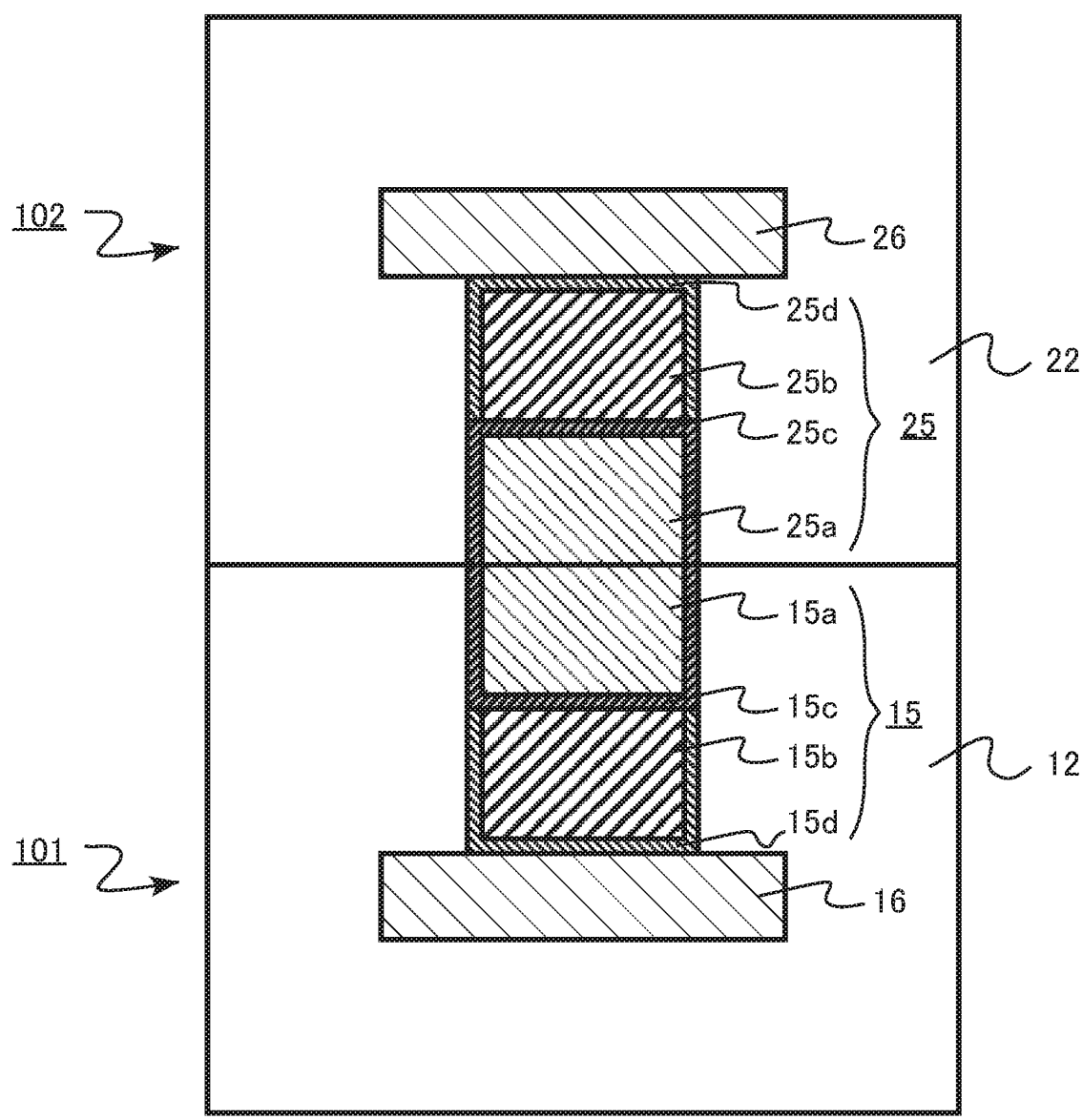
FIG. 12 is a schematic cross-sectional view of a semiconductor device according to a second embodiment.

FIG. 12 is a schematic cross-sectional view of the semiconductor device according to the second embodiment.

In the insulating layer 12 of the first substrate 101, a metal electrode 15 and a wiring layer 16 (first conductive layer) are provided. The metal electrode 15 includes a surface electrode 15a (first metal layer), a buried electrode 15b (second metal layer), a barrier metal 15c, and a barrier metal 15d.

The barrier metal 15c is provided between the surface electrode 15a and the buried electrode 15b. The barrier metal 15d is provided between the buried electrode 15b and the wiring layer 16.

The barrier metal 15c and the barrier metal 15d have, for example, a metal or a metal nitride. The barrier metal 15c and the barrier metal 15d have, for example, titanium (Ti), titanium nitride (TiN), tantalum (Ta), or tantalum nitride (TaN).

In the insulating layer 22 of the second substrate 102, a metal electrode 25 and a wiring layer 26 (second conductive layer) are provided. The metal electrode 25 includes a surface electrode 25a (third metal layer), a buried electrode 25b (fourth metal layer), a barrier metal 25c, and a barrier metal 25d.

The barrier metal 25c is provided between the surface electrode 25a and the buried electrode 25b. The barrier metal 25d is provided between the buried electrode 25b and the wiring layer 26.

The barrier metal 25c and the barrier metal 25d have, for example, a metal or a metal nitride. The barrier metal 25c and the barrier metal 25d have, for example, titanium (Ti), titanium nitride (TiN), tantalum (Ta), or tantalum nitride (TaN).

As described above, according to the second embodiment, a semiconductor device can be achieved which is capable of lowering the temperature for the annealing treatment, as in the first embodiment.

Third Embodiment

A semiconductor device according to a third embodiment is different from the semiconductor device according to the first embodiment in that a second metal layer has a narrow portion. Hereinafter, the description of content that overlaps with the first embodiment will be partially omitted.

Figure 13:
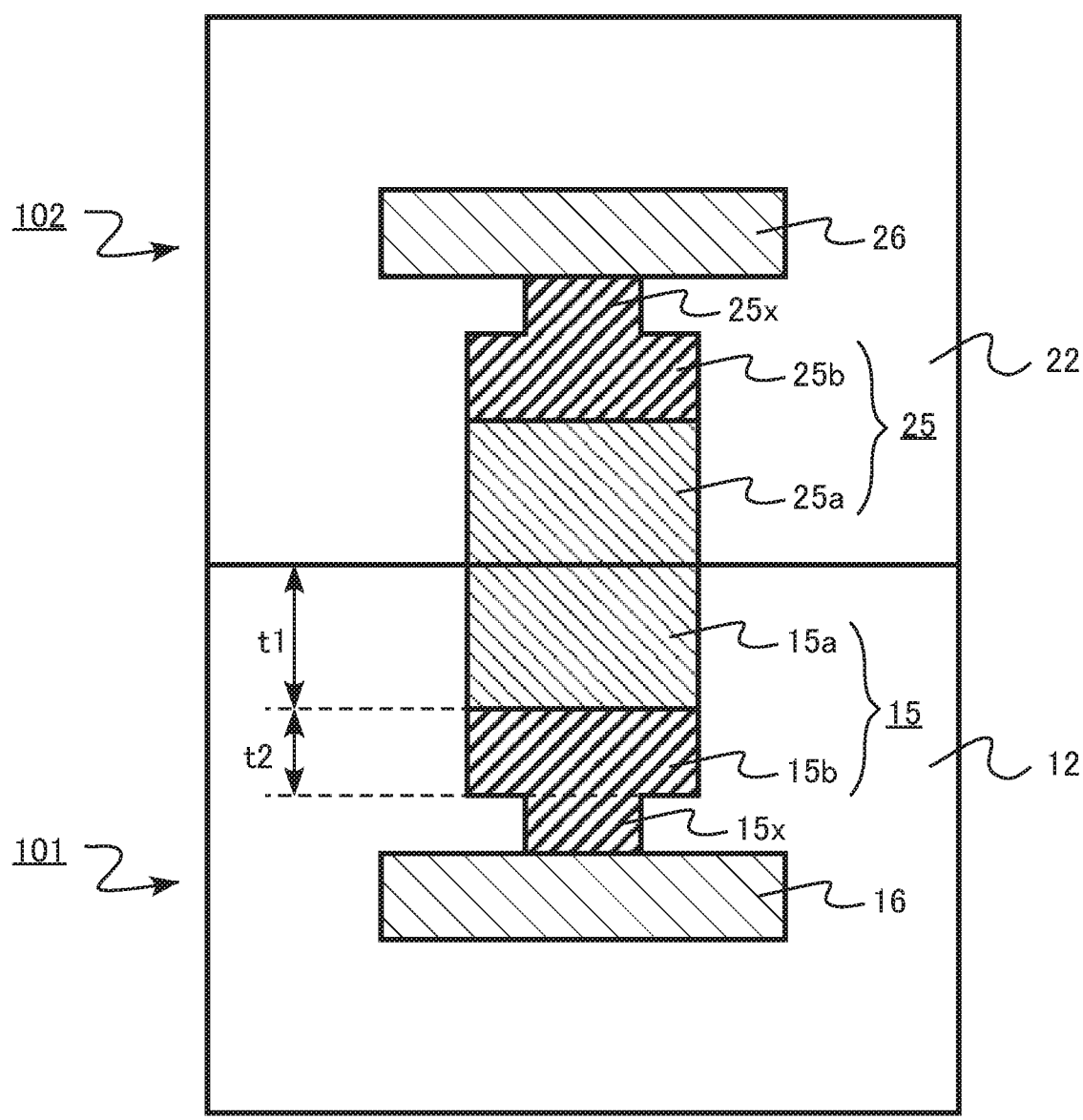
FIG. 13 is a schematic cross-sectional view of a semiconductor device according to a third embodiment.

FIG. 13 is a schematic cross-sectional view of the semiconductor device according to the third embodiment.

In the insulating layer 12 of the first substrate 101, a metal electrode 15 and a wiring layer 16 (first conductive layer) are provided. The metal electrode 15 includes a surface electrode 15a (first metal layer) and a buried electrode 15b (second metal layer).

The buried electrode 15b has a narrow portion 15x. A thickness (t2 in FIG. 13) of the buried electrode 15b in the first direction (z direction) is defined as a thickness excluding the narrow portion 15x.

In the insulating layer 22 of the second substrate 102, a metal electrode 25 and a wiring layer 26 (second conductive layer) are provided. The metal electrode 25 includes a surface electrode 25a (third metal layer) and a buried electrode 25b (fourth metal layer).

The buried electrode 25b has a narrow portion 25x. A thickness of the buried electrode 25b in the first direction (z direction) is defined as a thickness excluding the narrow portion 25x.

As described above, according to the third embodiment, a semiconductor device can be achieved which is capable of lowering the temperature for the annealing treatment, as in the first embodiment.

In the first to third embodiments, cases where a logic circuit is formed in the first substrate and a photodiode is formed in the second substrate have been described as examples, but the present disclosure is not limited to the configurations. For example, it is also possible to adopt a configuration where any semiconductor circuit such as a logic circuit or a memory circuit is formed in either or both of the first substrate and the second substrate. Further, it is also possible to adopt an embodiment where either one of the first substrate and the second substrate has no semiconductor circuit provided, but only a metal wiring provided, for example.

In the first to third embodiments, cases where the first substrate and the second substrate are both wafers, that is, Wafer on Wafer cases have been described as examples. However, for example, also in a case where either one of the first substrate and the second substrate is a semiconductor chip, that is, a so-called Chip on Wafer case, the present disclosure is applicable. Further, for example, also in a case where both the first substrate and the second substrate are semiconductor chips, that is, a so-called Chip on Chip case, the present disclosure is applicable.

In the first to third embodiments, cases where the second substrate has a buried electrode have been described as examples, but it is also possible to adopt an embodiment where the second substrate has no buried electrode, whereas only the first substrate has a buried electrode.

While certain embodiments have been described, these embodiments have been presented by way of example only, and are not intended to limit the scope of the inventions. Indeed, the semiconductor devices described herein may also be embodied in a variety of other forms; various omissions, substitutions and changes in the form of the device and methods described herein may be departing from the spirit of the inventions. The accompanying claims and their equivalents are intended to cover such forms or modifications as would fall within the scope and spirit of the inventions.

What is claimed is:

1. A semiconductor device, comprising:
    a first substrate including:
        a first insulating layer,
        a first conductive layer provided in the first insulating layer,
        a first metal layer provided in the first insulating layer, the first metal layer including a metal containing copper as its main constituent, and
        a second metal layer provided between the first metal layer and the first conductive layer, a linear expansion coefficient of the second metal layer being higher than a linear expansion coefficient of the first metal layer; and
    a second substrate in direct contact with the first substrate, the second substrate including:
        a second insulating layer,
        a second conductive layer provided in the second insulating layer,
        a third metal layer provided in the second insulating layer, the third metal layer being in direct contact with the first metal layer, the third metal layer including a metal containing copper as its main constituent, and
        a fourth metal layer provided between the third metal layer and the second conductive layer, a linear expansion coefficient of the fourth metal layer being higher than a linear expansion coefficient of the third metal layer,
    wherein the first insulating layer includes a first hole, and both the first metal layer and the second metal layer are provided in the first hole,
    wherein the second insulating layer includes a second hole, and both the third metal layer and the fourth metal layer are provided in the second hole,
    wherein the first hole further includes a first barrier layer provided between the first metal layer and the second metal layer, and between the first metal layer and the first insulating layer, and a second barrier layer provided between the second metal layer and the first conductive layer, and between the second metal layer and the first insulating layer, wherein side walls of the first barrier layer and the second barrier layer are aligned in a first direction in which the first metal layer and the second metal layer are stacked.

2. The semiconductor device according to claim 1, wherein the first metal layer and the third metal layer are made of a same material.

3. The semiconductor device according to claim 1, wherein the second metal layer includes a metal containing aluminum as its main constituent.

4. The semiconductor device according to claim 1,
    wherein a thickness of the second metal layer in the first direction is 30% or more of a sum of a thickness of the first metal layer in the first direction and the thickness of the second metal layer in the first direction.

5. The semiconductor device according to claim 1,
    wherein when a direction perpendicular to the first direction is referred to as a second direction,
    a width of the second metal layer in the second direction is narrower than a width of the first conductive layer in the second direction.

6. The semiconductor device according to claim 1, wherein the fourth metal layer includes a metal containing aluminum as its main constituent.

7. The semiconductor device according to claim 1, wherein the first insulating layer and the second insulating layer directly contact each other.

8. The semiconductor device according to claim 2, wherein the first insulating layer and the second insulating layer directly contact each other.

9. The semiconductor device according to claim 1, wherein the fourth metal layer is in direct contact with the third metal layer.

10. The semiconductor device according to claim 1,
wherein when a direction perpendicular to the first direction is referred to as a second direction, and a direction perpendicular to both the first direction and the second direction is referred to as a third direction,
widths of the first metal layer and the second metal layer in the second direction are substantially equal, and
widths of the first metal layer and the second metal layer in the third direction are substantially equal.

11. The semiconductor device according to claim 1, wherein both the third metal layer and the fourth metal layer are surrounded by the second insulating layer.

12. A semiconductor device, comprising:
a first substrate including:
a first insulating layer,
a first conductive layer provided in the first insulating layer,
a first metal layer provided in the first insulating layer,
a second metal layer provided between the first metal layer and the first conductive layer, a linear expansion coefficient of the second metal layer being higher than a linear expansion coefficient of the first metal layer,
a first barrier metal provided between the first metal layer and the second metal layer, and between the first metal layer and the first insulating layer, and
a second barrier metal provided between the second metal layer and the first conductive layer, and between the second metal layer and the first insulating layer; and
a second substrate in direct contact with the first substrate, the second substrate including:
a second insulating layer,
a second conductive layer provided in the second insulating layer,
a third metal layer provided in the second insulating layer, the third metal layer being in direct contact with the first metal layer, and
a fourth metal layer provided between the third metal layer and the second conductive layer, a linear expansion coefficient of the fourth metal layer being higher than a linear expansion coefficient of the third metal layer,
wherein the first insulating layer includes a first hole, and both the first metal layer and the second metal layer are provided in the first hole,
wherein the second insulating layer includes a second hole, and both the third metal layer and the fourth metal layer are provided in the second hole, and
wherein the second metal layer and the first metal layer are stacked in a first direction, and a width of the first metal layer and a width of the second metal layer, in a second direction perpendicular to the first direction, are substantially equal.

13. The semiconductor device according to claim 12, wherein the first barrier metal includes titanium or titanium nitride, and the second barrier metal includes titanium or titanium nitride.

14. The semiconductor device according to claim 1, wherein:
the second metal layer has a first narrow portion and a first wide portion, the first narrow portion being provided between the first conductive layer and the first wide portion,
the second metal layer includes a first step between the first narrow portion and the first wide portion,
the fourth metal layer has a second narrow portion and a second wide portion, the second narrow portion being provided between the second conductive layer and the second wide portion, and
the fourth metal layer includes a second step between the second narrow portion and the second wide portion.

15. The semiconductor device according to claim 12, wherein:
the second metal layer has a first narrow portion and a first wide portion, the first narrow portion being provided between the first conductive layer and the first wide portion,
the second metal layer includes a first step between the first narrow portion and the first wide portion,
the fourth metal layer has a second narrow portion and a second wide portion, the second narrow portion being provided between the second conductive layer and the second wide portion, and
the fourth metal layer includes a second step between the second narrow portion and the second wide portion.

16. The semiconductor device according to claim 12, wherein a distance between portions of the first insulating layer sandwiching the first barrier metal and the first metal layer in the second direction in a cross section parallel to the first direction at a vicinity of an interface between the first barrier metal and the first metal layer is substantially equal to a distance between portions of the first insulating layer sandwiching the second barrier metal and the second metal layer in the second direction in the cross section parallel to the first direction at a vicinity of an interface between the first barrier metal and the second metal layer.

17. The semiconductor device according to claim 12, wherein an interface between the first insulating layer and the first barrier metal and an interface between the first insulating layer and the second barrier metal are on a straight line in a cross section parallel to the first direction.

* * * * *